United States Patent
Ito et al.

(10) Patent No.: US 8,604,354 B2
(45) Date of Patent: Dec. 10, 2013

(54) PRINTED WIRING BOARD, METHOD OF MANUFACTURING PRINTED WIRING BOARD, AND METHOD OF CONNECTING PRINTED WIRING BOARD

(75) Inventors: Shoji Ito, Sakura (JP); Tomofumi Kitada, Sakura (JP); Tadanori Ominato, Sakura (JP)

(73) Assignee: Fujikura Ltd., Tokyo (JP)

( * ) Notice: Subject to any disclaimer, the term of this patent is extended or adjusted under 35 U.S.C. 154(b) by 264 days.

(21) Appl. No.: 12/645,191

(22) Filed: Dec. 22, 2009

(65) Prior Publication Data

US 2010/0163289 A1 Jul. 1, 2010

(30) Foreign Application Priority Data

Dec. 26, 2008 (JP) ................. 2008-332676

(51) Int. Cl.
*H05K 1/02* (2006.01)

(52) U.S. Cl.
USPC .......... 174/259; 174/254; 174/255; 174/261; 174/263; 174/267

(58) Field of Classification Search
USPC .................. 174/259, 263; 361/772
See application file for complete search history.

(56) References Cited

U.S. PATENT DOCUMENTS

| | | | |
|---|---|---|---|
| 4,740,657 A * | 4/1988 | Tsukagoshi et al. | 174/88 R |
| 5,065,505 A * | 11/1991 | Matsubara et al. | 29/830 |
| 6,320,254 B1 * | 11/2001 | Liou et al. | 257/688 |
| 6,495,758 B2 * | 12/2002 | Saitoh | 174/94 R |
| 6,506,978 B1 * | 1/2003 | Furihata | 174/254 |
| 2005/0029550 A1 * | 2/2005 | Lee et al. | 257/202 |

FOREIGN PATENT DOCUMENTS

| | | |
|---|---|---|
| CN | 1287285 A | 3/2001 |
| CN | 1784111 A | 6/2006 |
| JP | 07-135039 A | 5/1995 |
| JP | 11-354221 A | 12/1999 |
| JP | 2006-310583 A | 11/2006 |

OTHER PUBLICATIONS

Chinese Office Action issued Jun. 27, 2011 in Chinese Corr. Application No. 200910260583.0.
Office Action issued by Chinese Patent Office in Chinese Application No. 200910260583.0 dated Jun. 18, 2012.
Office Action issued by the Japanese Patent Office in Japanese Application No. 2008-332676 dated May 29, 2012.

* cited by examiner

*Primary Examiner* — Tuan T Dinh
*Assistant Examiner* — Steven Sawyer
(74) *Attorney, Agent, or Firm* — Sughrue Mion, PLLC

(57) ABSTRACT

A printed wiring board including: an insulated substrate; a conductive circuit provided on one side of this insulated substrate; a cover layer covering the insulated substrate and the conductive circuit; and a conductive particle buried in this cover layer, wherein the conductive particle is buried in the cover layer so that the conductive particle contacts the conductive circuit and protrudes from the cover layer; and the conductive particle serves as an electric contact point.

3 Claims, 7 Drawing Sheets

US 8,604,354 B2

PRINTED WIRING BOARD, METHOD OF MANUFACTURING PRINTED WIRING BOARD, AND METHOD OF CONNECTING PRINTED WIRING BOARD

BACKGROUND OF THE INVENTION

The present application claims priority on Japanese Patent Application No. 2008-332676, filed Dec. 26, 2008, the content of which is incorporated herein by reference.

FIELD OF THE INVENTION

The present invention relates to a printed wiring board, a method of manufacturing a printed wiring board, and a method of connecting a printed wiring board. In particular, the present invention relates to a printed wiring board such that crosstalk between each conductive circuit is prevented when the printed wiring boards are connected to each other, a method of manufacturing such printed wiring board, and a method of connecting the printed wiring board.

DESCRIPTION OF THE RELATED ART

The functions of compact electronic devices such as cellular phones are becoming increasingly sophisticated. Accompanying this trend, there is a demand for reducing the size of electronic components which are equipped on the printed wiring board. Specifically, the size of the electronic components is to be decreased without affecting the function of the electronic component.

In particular, the height of the connector equipped on the printed wiring board is large, and the connector takes up a large amount of area on the printed wiring board. As a result, the connector acts as a hindrance to reducing the size of the electronic device and enhancing the functions of the electronic device.

In order to reduce the volume of this connector, an Anisotropic Conductive Film (hereinafter may be referred to as "ACF" in short) is frequently used in the connection between printed wiring boards in compact electronic devices such as cellular phones. This ACF is a conductive film such that conductive particles (filler) are dispersed inside an adhesive resin such as epoxy resin and acrylic resin.

FIG. 17 is a skeletal cross-sectional diagram representing an example of a method of connecting a printed wiring board, using a conventional printed wiring board.

According to a method of connecting the conventional printed wiring board shown in FIG. 17, two printed wiring boards (a first printed wiring board 100 and a second printed wiring board 110) are connected to each other via an ACF 120.

The first printed wiring board 100 includes an insulated substrate 101, a conductive circuit 102 equipped on one side 101a of the insulated substrate 101, and a cover layer 103 covering the insulated substrate 101 and the conductive circuit 102. In addition, a part of the conductive circuit 102 is exposed without being covered by the cover layer 103.

Similarly, the second printed wiring board 110 includes a conductive circuit 112 equipped on one side 111a of an insulated substrate 111, and a cover layer 113 covering the insulated substrate 111 and the conductive circuit 112. In addition, a part of the conductive circuit 112 is exposed without being covered by the cover layer 113.

Furthermore, the ACF 120 includes an adhesive resin 121 and conductive particles 122 dispersed inside the adhesive resin 121.

In other words, according to the method of connecting the printed wiring board, a terminal unit 102a of the conductive circuit 102 of the first printed wiring board 100 and a terminal unit 112a of the conductive circuit 112 of the second printed wiring board 110 are electrically connected to each other via the conductive particle 122, by contacting the terminal unit 102a and the terminal unit 112a with the conductive particle 122 of the ACF 120. At the same time, these printed wiring boards are bonded together by the adhesive resin 121. As a result, the condition in which these printed wiring boards are electrically connected to each other is fixed (see, for example, Japanese Unexamined Patent Application, First Publication No. H7-135039).

However, the method of connecting the printed wiring boards as described above using the ACF triggers the following problem, as shown in FIG. 18 and illustrated below.

In other words, when the first printed wiring board 200, which includes the insulated substrate 201 and the conductive circuit 202, is connected to the second printed wiring board 210, which includes the insulated substrate 211 and the conductive circuit 212, via the ACF 220, the conductive particles 222 dispersed inside the adhesive resin 221 of the ACF 200 remain interposed between the terminal unit 202a of the conductive circuit 202 and the terminal unit 212a of the conductive circuit 212 (see, for example, conductive particles 222A shown in FIG. 18). In addition, the conductive particles 222 might exist between the terminal units 202a, or, the conductive particles 222 might exist between the terminal units 212a (see, for example, conductive particle 222B shown in FIG. 18).

As a result, the completed device obtained by connecting the first printed wiring board 200 and the second printed wiring board 210 includes the conductive particle 222B, which is unrelated to the electrical connection between these printed wiring boards. Therefore, there is a problem in that the efficiency with which these printed wiring boards are connected to each other decreases.

In addition, the conductive particle 222B existing between the terminal units 202a of the conductive circuit 202 or between the terminal units 212a of the conductive circuit 212 might trigger a crosstalk between these terminal units. Therefore, it is difficult to reduce the distance (pitch) between the terminal unit 202a and the terminal unit 212a. Moreover, it is difficult to decrease the area of the printed wiring board. Furthermore, a crosstalk between the terminal units, triggered by the conductive particles 222B existing between the terminal units, becomes a hindrance when the method of connecting the printed wiring boards through an ACF is applied to electronic devices used in environments of high electric voltage or high electric current.

SUMMARY OF THE INVENTION

The present invention is made considering the problems described above. Accordingly, an object of the present invention is to provide a printing wiring board, a method of manufacturing a printed wiring board, and a method of connecting a printed wiring board such that crosstalk between each conductive circuit is prevented when the printed wiring boards are connected to each other.

Namely, a printed wiring board according to an aspect of the present invention includes an insulated substrate; a conductive circuit provided on one side of this insulated substrate; a cover layer covering the insulated substrate and the conductive circuit; and a conductive particle buried in this cover layer, wherein the conductive particle is buried in the cover layer so that the conductive particle contacts the conductive circuit and protrudes from the cover layer; and the conductive particle serves as an electric contact point.

In addition, the printed wiring board may be configured as follows: an adhesive layer is provided on at least a part of a side opposite to a side at which the cover layer contacts the conductive circuit, and this adhesive layer covers the conductive particle.

In addition, the printed wiring board may be configured as follows: the adhesive layer includes a thermoplastic resin.

In addition, the printed wiring board may be configured as follows: the cover layer includes a coverlay film; a pore is provided on this coverlay film; an inequality $d_1 < d_2$ is satisfied when an inner diameter of the pore equals $d_1$ and the diameter of the conductive particle equals $d_2$; and the conductive particle is inserted in the pore from a side at which the coverlay film contacts the conductive circuit.

In addition, the printed wiring board may be configured as follows: the cover layer includes a coverlay film; a pore is provided on this coverlay film, the pore tapering gradually from a first side at which the coverlay film contacts the conductive circuit to a second side opposite to the first side at which the coverlay film contacts the conductive circuit; an inequality $d_3 < d_4$ is satisfied when $d_3$ equals an inner diameter of the pore at the second side opposite to the first side at which the coverlay film contacts the conductive circuit, and $d_4$ equals another inner diameter of the pore at the first side at which the coverlay film contacts the conductive circuit; and the conductive particle is inserted in the pore from the first side at which the coverlay film contacts the conductive circuit.

In addition, the printed wiring board may be configured as follows: the conductive particle includes a resin particle and a metal layer formed on a surface of this resin particle.

Meanwhile, a connection method of a printed wiring board according to an aspect of the present invention connecting a first printed wiring board including an insulated substrate, a conductive circuit provided on one side of this insulated substrate, a cover layer covering the insulated substrate and the conductive circuit, and a conductive particle buried in this cover layer, wherein the conductive particle is buried in the cover layer so that the conductive particle contacts the conductive circuit and protrudes from the cover layer; and a second printed wiring board including an insulated substrate, a conductive circuit provided on one side of this insulated substrate, a cover layer covering the insulated substrate and the conductive circuit, wherein at least a part of the conductive circuit is exposed; includes: a step contacting the conductive particle of the first printed wiring board with the conductive circuit of the second printed wiring board; and a step bonding a contacting portion of the conductive particle and the conductive circuit, as well as an area surrounding the contacting portion, with an adhesive.

In addition, the connection method may be configured as follows: the adhesive includes a thermoplastic resin.

In addition, the connection method may be configured as follows: the adhesive includes an adhesive layer covering the conductive particle; and the adhesive layer is provided on at least a part of a side opposite to a side at which the cover layer contacts the conductive circuit.

In addition, the connection method may be configured as follows: the cover layer includes a coverlay film; a pore is provided on this coverlay film; an inequality $d_1 < d_2$ is satisfied when an inner diameter of the pore equals $d_1$ and a diameter of the conductive particle equals $d_2$; the connection method further comprising a step inserting the conductive particle in the pore from a side at which the coverlay film contacts the conductive circuit.

In addition, the connection method may be configured as follows: the cover layer includes a coverlay film; a pore is provided on this coverlay film, the pore tapering gradually from a first side at which the coverlay film contacts the conductive circuit to a second side opposite to the first side at which the coverlay film contacts the conductive circuit; an inequality $d_3 < d_4$ is satisfied when $d_3$ equals an inner diameter of the pore at the second side opposite to the first side at which the coverlay film contacts the conductive circuit, and $d_4$ equals another inner diameter of the pore at the first side at which the coverlay film contacts the conductive circuit; and the connection method further includes a step inserting the conductive particle in the pore from the first side at which the coverlay film contacts the conductive circuit.

In addition, the connection method may be configured as follows: the conductive particle includes a resin particle and a metal layer formed on a surface of this resin particle; and the conductive particle is connected to a terminal of the second printed wiring board by pressing the first printed wiring board and the second printed wiring board, and by having the conductive particle undergo an elastic deformation or a plastic deformation.

Meanwhile, a manufacturing method of a printed wiring board according to an aspect of the present invention including an insulated substrate, a conductive circuit provided on one side of this insulated substrate, a cover layer covering the insulated substrate and the conductive circuit, and a conductive particle buried in this cover layer, includes: a step providing the conductive circuit on one side of the insulated substrate; a step providing the conductive particle on a side opposite to a side at which the conductive circuit contacts the insulated substrate; a step providing the cover layer so that at least a top portion of the conductive particle is exposed, and the cover layer covers the insulated substrate and the conductive circuit.

Meanwhile, a manufacturing method of a printed wiring board according to an aspect of the present invention including an insulated substrate, a conductive circuit provided on one side of this insulated substrate, a cover layer covering the insulated substrate and the conductive circuit, and a conductive particle buried in this cover layer, includes: a step providing the conductive circuit on one side of the insulated substrate; a step using a coverlay film as a material of the cover layer and providing a pore on this coverlay film; a step packing the conductive particle in the pore so that at least a top portion of the conductive particle is exposed; and a step bonding the coverlay film, in which the conductive particle is packed, with the insulated substrate, on which the conductive circuit is provided, so that the conductive particle contacts the conductive circuit.

In addition, the manufacturing method may be configured as follows: the step providing the pore on the coverlay film includes: providing a tapered pore on the coverlay film so that a diameter of the tapered pore gradually decreases from a side at which the coverlay film contacts the conductive circuit to a side opposite to the side at which the coverlay film contacts the conductive circuit.

As described above, the printed wiring board according to an aspect of the present invention includes an insulated substrate, a conductive circuit provided on one side of this insulated substrate, a cover layer covering the insulated substrate and the conductive circuit, and a conductive particle embedded in this cover layer. The conductive particle is embedded in the cover layer so that the conductive particle is in contact with the conductive circuit, and the conductive particle protrudes more than the cover layer. The printed wiring board and another printed wiring board can be electrically connected through this conductive particle. Therefore, unlike conventional technology, it is not necessary to use an ACF. Thus, it is possible to prevent a conductive particle included in the ACF from entering in between the conductive circuits of the printed wiring board and causing a crosstalk between the conductive circuits. Therefore, the area of the printed wiring board can be reduced. At the same time, an electronic device including the printed wiring board can be applied in environments of high electric voltage and high electric current.

According to a method of connecting a printed wiring board based on an aspect of the present invention, a first printed wiring board and a second printed wiring board are connected to each other, the printed wiring board including an insulated substrate, a conductive circuit provided on one side of this insulated substrate, a cover layer covering the insulated substrate and the conductive circuit, and a conductive particle embedded in this cover layer. Regarding the first printed wiring board, the conductive particle is in contact with the conductive circuit, and the conductive particle is embedded in the cover layer so that the conductive particle protrudes from the cover layer. The second printed wiring board includes an insulated substrate, a conductive circuit provided in one side of this insulated substrate, and a cover layer covering the insulated substrate and the conductive circuit, wherein at least a part of the conductive circuit is exposed. The conductive particle of the first printed wiring board comes in contact with the conductive circuit of the second printed wiring board. This contacting portion and the area surrounding the contacting portion are bonded with an adhesive. In other words, two printed wiring boards are electrically connected to each other through a conductive particle provided on the conductive circuit of the printed wiring board. Therefore, unlike conventional technology, these printed wiring boards can be connected to each other without using an ACF. Furthermore, it is possible to prevent a conductive particle, included in the ACF, from entering in between the conductive circuit of each printed wiring board and causing a crosstalk between these conductive circuits.

According to a method of manufacturing a printed wiring board based on an aspect of the present invention, a printed wiring board is manufactured, which includes an insulated substrate, a conductive circuit provided on one side of this insulated substrate, a cover layer covering the insulated substrate and the conductive circuit, and a conductive particle embedded in this cover layer. This manufacturing method includes a step providing the conductive circuit to one side of the insulated substrate, a step providing the conductive particle on a side opposite to a side at which the conductive circuit and the insulated substrate are in contact with each other, and a step providing a cover layer so that at least a top portion of the conductive particle is exposed and the cover layer covers the insulated substrate and the conductive circuit. Therefore, it is possible to manufacture a printed wiring board on which the conductive particle is fixed on the conductive circuit while the top portion of the conductive particle is protruding from a coverlay film.

According to a method of manufacturing a printed wiring board based on an aspect of the present invention, a printed wiring board is manufactured, which includes an insulated substrate, a conductive circuit provided on one side of this insulated substrate, a cover layer covering the insulated substrate and the conductive circuit, and a conductive particle embedded in this cover layer. This manufacturing method includes a step providing the conductive circuit on one side of the insulated substrate, a step using a coverlay film as the material for the cover layer and forming a pore penetrating this coverlay film, and a step placing the conductive particle in the pore so that at least a top portion of the conductive particle is exposed, and a step bonding the coverlay film embedded with the conductive particle, with the insulated substrate on which the conductive circuit is provided, so that the conductive particle is in contact with the conductive circuit. Therefore, it is possible to manufacture a printed wiring board such that the conductive particle is fixed on the conductive circuit while the top portion of the conductive particle is protruding from the coverlay film.

DETAILED DESCRIPTION OF THE PREFERRED EMBODIMENTS

Figure 1A:
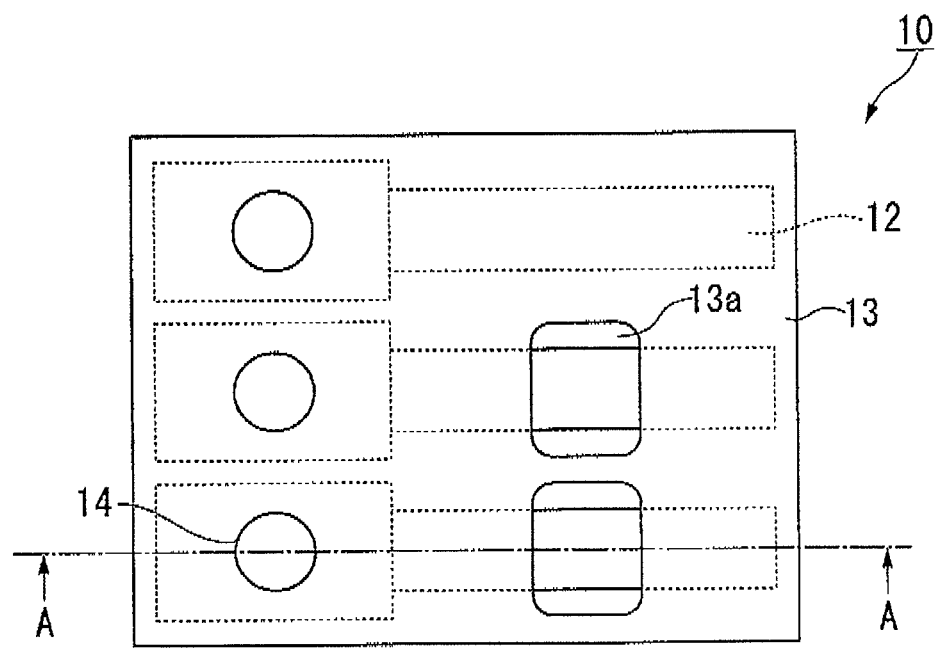
FIG. 1A is a plane view showing a printed wiring board according to a first embodiment of the present invention.

Hereunder, a printed wiring board, a method of manufacturing a printed wiring board, and a method of connecting a printed wiring board according to an aspect of the present invention is described.

The following description aims to provide a detailed explanation to facilitate the gist of the present invention. Therefore, the following description does not limit the present invention in any way, unless otherwise noted.

(1) First Embodiment

First, a first embodiment of the present invention is described with respect to FIGS. 1A to 3. A printed wiring board 10 according to the first embodiment of the present invention (hereinafter, may be simply referred to as a "printed wiring board") includes an insulated substrate 11, a conductive circuit 12 provided on one side 11a of the insulated substrate 11, a cover layer 13 covering the insulated substrate 11 and the conductive circuit 12, and a conductive particle 14 embedded in the cover layer 13.

In addition, the conductive particle 14 is embedded in the cover layer 13 so that the conductive particle 14 is in contact with the conductive circuit 12, and the conductive particle 14 protrudes from the cover layer 13. In other words, the conductive particle 14 is provided on a side 12a (hereinafter may be referred to as "a second side") opposite to a side at which the conductive circuit 12 and the insulated substrate 11 are in contact with each other. The conductive particle 14 is faxed on the second side 12a of the conductive circuit 12 by the cover layer 13, so that at least a top portion of the conductive particle 14 is exposed.

Therefore, the conductive particle 14, which is embedded in the cover layer 13, acts as an electronic contact point of the printed wiring board 10.

Furthermore, an opening part 13a is provided on the cover layer 13 so that an electronic component can be mounted. The conductive circuit 12 is exposed from this opening part 13a.

There is no limitation regarding the extent to which the conductive particle 14 protrudes from the cover layer 13 (in other words, the amount of protrusion of the conductive particle 14). Here, the amount of protrusion refers to the distance between a top portion 14a of the conductive particle 14 and a side 13b which is opposite to the side at which the cover layer 13 is in contact with the conductive circuit. This amount of protrusion is measured in the direction of the height of the printed wiring board 10. The side 13b may also be referred to as a "third side." The amount of protrusion can be of any length as long as the conductive circuit of each printed wiring board comes in contact with each other only at a predetermined portion (in other words, at the terminal unit), when the printed wiring board 10 is connected to another printed wiring board through the conductive particle 14.

A flexible, insulated material is used as the insulated substrate 11. This insulated substrate 11 may be in the form of a film, a sheet, or a thin plate.

A thermoplastic resin is preferred as this type of insulated material. For example, considering a polyimide type resin, an epoxide resin, a liquid crystal polymer (LCP) resin, a glass epoxy, an aramid fiber, and Teflon (registered trademark), at least one type or more than two types among the above are used as the insulated substrate 11. Among such insulated material, the thermoplastic polyimide type resin is easy to use, and is preferred.

For the conductive circuit 12, a conductive film of metal (metal film) such as copper, silver, and gold is used. Among these metals, copper is preferred because the specific resistance $\rho$ of copper is low ($\rho=1.55\mu\Omega\cdot cm$), and because copper is inexpensive.

Examples of the forms of the metal film used as the conductive circuit 12 include electrolytic foil, evaporated film, sputtered film, and print film formed by printing technology using a conductive paste.

As the material for the cover layer 13, an ordinary, epoxy type solder mask, and a cover-coating material such as a polyimide type cover-coating material, normally used to protect the circuit of the printed wiring board, are utilized.

For the conductive particle 14, a conductive, spherical particle is used. Examples of such conductive, spherical particle include a copper particle, a nickel particle coated with gold, a solder particle, a material comprising a resin particle and a metal layer provided on a surface of the resin particle (hereinafter, referred to as a "metal-layered resin particle).

There is no limitation in particular on the resin particle included in the metal-layered resin particle, as long as the resin particle can undergo an elastic deformation and a plastic deformation.

Examples of the metal layer included in the metal-layered resin particle include metallic plating such as nickel/gold coating, solder coating, and gold coating.

When the above described metal-layered resin particle is used as the conductive particle 14, and the printed wiring board 10 is connected to another printed wiring board through the conductive particle 14, the conductive particle 14 undergoes an elastic deformation or a plastic deformation due to the pressing of the printed wiring board. As a result, the contact area of the printed wiring board and the conductive particle 14 can be enlarged. Consequently, the printed wiring board 10 can be electrically contacted with another printed wiring board with more reliability.

In addition, when multiple conductive particles 14 are provided on the printed wiring board 10 and the outer diameters of each of the conductive particles are different, or when there is a step (difference in the thickness) between each of the terminals that are connected to the conductive particles 14 of the other printed wiring board, the terminal and the conductive particle 14 can be connected, due to the deformation of the conductive particle 14. It should be noted that, when there is a disparity in the outer diameter of the conductive particle 14, or when there is a difference in the thickness of each terminal, the conductivity may be impaired if the conductive particle does not undergo a deformation.

In addition, there is no particular limitation on the thickness of the cover layer 13 and the diameter of the conductive particle 14. However, when the thickness of the cover layer 13 equals $\alpha_1$, the radius of the conductive particle 14 equals $\alpha_2$, and the diameter of the conductive particle 14 equals $\alpha_3$, it is preferable that the variables $\alpha_1$, $\alpha_2$, and $\alpha_3$ satisfy the inequality $\alpha_{23}<\alpha_1<\alpha_3$, in order to adequately hold the conductive particle 14 with the cover layer 13.

For example, the thickness $\alpha_1$ of the cover layer 13 is set to 40 $\mu$m, and the diameter $\alpha_3$ of the conductive particle 14 is set to 75 $\mu$m.

According to this printed wiring board 10, the conductive particle 14 is placed on one side 12a of the conductive circuit 12. In addition, the conductive particle 14 is fixed to one side 12a of the conductive circuit 12 by the cover layer 13, so that at least the top portion 14a of this conductive particle 14 is exposed. Therefore, the printed wiring board 10 and another printed wiring board can be electrically connected via this conductive particle 14. Thus, unlike conventional printed wiring boards, it is not necessary to use an ACF. Hence, it is possible to prevent a conductive particle, included in the ACF, from entering the space between the printed wiring board 10 and the conductive circuit 12, and the space between the printed wiring board and the conductive circuit that are to be connected. In this way, it is possible to prevent the occurrence of a crosstalk between these conductive circuits. Consequently, the area of the printed wiring board 10 can be reduced. At the same time, an electronic device equipped with this printed wiring board 10 can be used in environments of high electric voltage or high electric current.

Figure 1B:
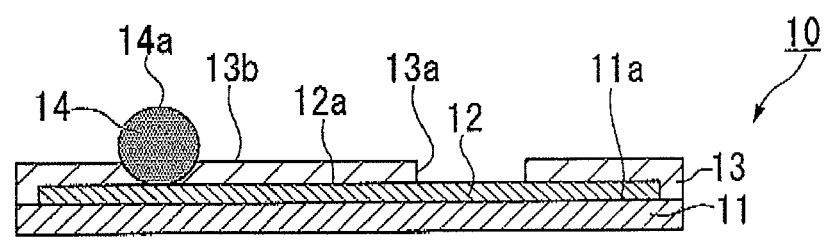
FIG. 1B is a skeletal diagram showing a printed wiring board according to the first embodiment of the present invention, and is a cross sectional view along an A-A line of FIG. 1A.

Next, a method of manufacturing this printed wiring board 10 is described with reference to FIGS. 1A and 1B.

First, the conductive circuit 12 is placed on one side 11a of the insulated substrate 11.

Next, a cover coating material 13 in liquid form is applied so as to cover the insulated substrate 11 and the conductive circuit 12.

Next, before the cover coating material 13 is solidified, the conductive particle 14 is placed at a predetermined position. At this time, the conductive particle 14 is placed so that the conductive particle 14 penetrates the cover coating material 13 in liquid form, and so that the conductive particle 14 comes in contact with the conductive circuit 12.

Next, the printed wiring board 10 is obtained by solidifying the cover coating material 13 by heating the cover coating material 13.

Next, a method of connecting the printed wiring board 10 with another printed wiring board is described with reference to FIG. 2.

Figure 2:
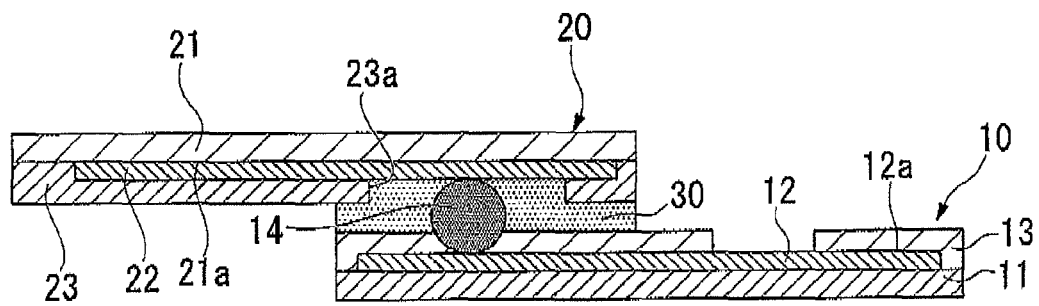
FIG. 2 is a skeletal cross sectional diagram showing an example of a method of manufacturing a printed wiring board according to the first embodiment of the present invention.

FIG. 2 is a skeletal cross sectional diagram representing an example of a connection method based on a first embodiment of the printed wiring board according to the present invention.

According to the method of connecting the printed wiring board shown in FIG. 2, two printed wiring boards (printed wiring board 10 and printed wiring board 20) are connected via an adhesive 30.

The printed wiring board 20 includes an insulated substrate 21, a conductive circuit 22, and a cover layer 23. The conductive circuit 22 is provided on one side 21a of the insulated substrate 21. The cover layer 23 is provided to cover the insulated substrate 21 and the conductive circuit 22. In addition, an opening portion 23a is provided on the cover layer 23. The conductive circuit 22 is exposed from this opening portion 23a.

In other words, according to the method of connecting the printed wiring method shown in FIG. 2, the printed wiring board 10 and the printed wiring board 20 are electrically connected via the conductive particle 14 by contacting the conductive circuit 22 of the printed wiring board 20 with the conductive particle 14. This conductive particle 14 is placed on one side 12a of the conductive circuit 12 of the printed wiring board 10. At the same time, the contacting portion of the conductive particle and the printed wiring board 10 and the printed wiring board 20, as well as the area surrounding the contacting portion, are bonded using the adhesive 30. As a result, the electric connection between the printed wiring board 10 and the printed wiring board 20 is fixed mechanically.

An adhesive in the form of liquid or a sheet is used as the adhesive 30. The adhesive includes an epoxy adhesive, an acrylic adhesive, a polyimide adhesive, and the like. Among these types of adhesives, an adhesive with a low rate of volume expansion in response to an application of heat and humidity is preferred.

In addition, a thermoplastic resin is used as the adhesive 30. Examples of this thermoplastic resin include polyethylene (PE), polypropylene (PP), polyvinylchloride (PVC), polystyrene (PS), acrylic resin (PMMA), and the like.

When such thermoplastic resin is used as the adhesive 30, the degree of elasticity changes reversibly in response to heat. Therefore, when there is a poor connection between the printed wiring board 10 and another printed wiring board, these printed wiring boards can be bonded together by first detaching the printed wiring board 10 from the other printed wiring board by heating them again, and then heating them further.

According to the method of connecting the printed wiring board shown in FIG. 2, the printed wiring board 10 and the printed wiring board 20 are electrically connected through the conductive particle 14. This conductive particle 14 is placed on one side 12a of the conductive circuit 12 of the printed wiring board 10. Therefore, unlike conventional technology, these printed wiring boards can be connected without using an ACF. In addition, it is possible to prevent a conductive particle included in the ACF from entering in between the conductive circuit 12 of the printed wiring board 10 or in between the conductive circuit 12 of the printed wiring board 20, and causing a crosstalk between these conductive circuits.

Figure 3:
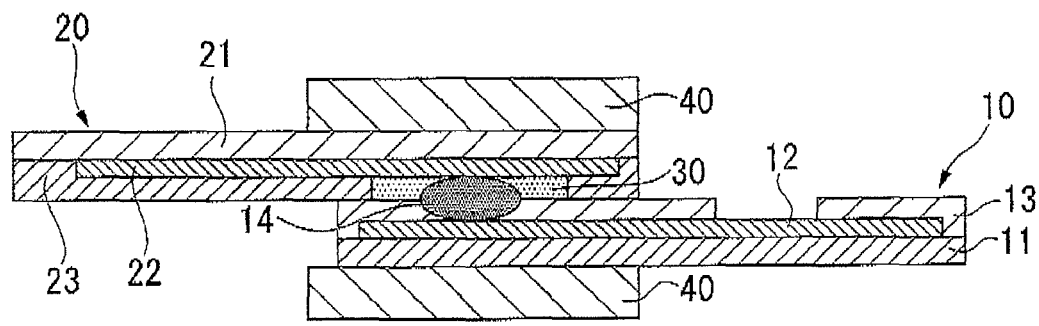
FIG. 3 is a skeletal cross sectional diagram showing another example of a method of manufacturing a printed wiring board according to the first embodiment of the present invention.

FIG. 3 is a skeletal cross sectional diagram representing another example of a method of connecting the printed wiring board according to the above embodiment of the present invention.

The connection method of the printed wiring board shown in FIG. 3 differs from the connection method of the printed wiring board shown in FIG. 2, in that the above referenced metal-layered resin particle is used as the conductive particle 14, the printed wiring board 10 and the printed wiring board 20 are sandwiched with a pair of stainless sheets 40-40, and these stainless sheets 40-40 are screwed together.

In other words, according to the connection method of the printed wiring board shown in FIG. 3, the printed wiring board 10 and the printed wiring board 20 are pressed together in the direction in which these wiring boards face each other (in other words, the direction in which these wiring boards approach one another), with the pressure (in other words, the pressing force) applied when the stainless sheets 40-40 are screwed together. As a result, the conductive particle 14 undergoes an elastic deformation or a plastic deformation. Thus, the contacting area between the conductive particle 14 and the printed wiring board 10 and the printed wiring board 20 enlarges.

According to the method of connecting the printed wiring board shown in FIG. 3, the printed wiring board 10 and the printed wiring board 20 are pressed together, the conductive particle 14 undergoes an elastic deformation or a plastic deformation, and the contact area between the conductive particle 14 and the printed wiring board 10 and the printed wiring board 20 is enlarged. As a result, the printed wiring board 10 and the printed wiring board 20 can be electrically connected to each other with more reliability.

Further, when multiple conductive particles 14 are provided on the printed wiring board 10 and the outer diameters of each of the conductive particles are different, or when there is a step (difference in the thickness) between each of the terminals that are connected to the conductive particles 14 of the other printed wiring board, the terminal and the conductive particle 14 can be connected, due to the deformation of the conductive particle 14. It should be noted that, when there is a disparity in the outer diameter of the conductive particle 14, or when there is a difference in the thickness of each terminal, the conductivity may be impaired if the conductive particle 14 does not undergo a deformation.

(2) Second Embodiment

Figure 4:
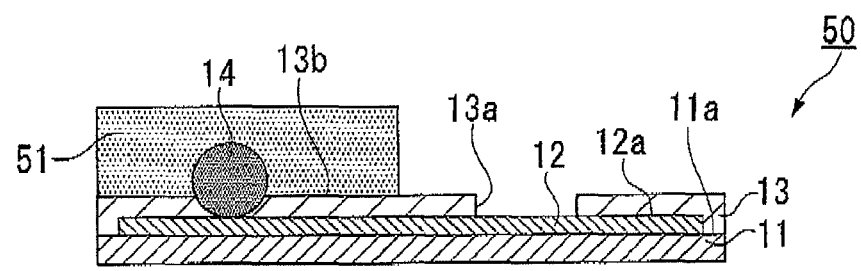
FIG. 4 is a skeletal cross sectional diagram showing a printed wiring board according to a second embodiment of the present invention.

FIG. 4 is a skeletal cross sectional diagram representing a printed wiring board according to a second embodiment of the present invention.

In FIG. 4, the components that are the same as those described in the first embodiment are referenced using the same reference numbers. In this way, components overlapping in the first and second embodiments will not be described.

The printed wiring board 50 according to the second embodiment differs from the printed wiring board 10 according to the first embodiment, in that an adhesive layer 51 is provided on a part of one side 13b of the cover layer 13 so as to cover the conductive particle 14.

An adhesive similar to the above referenced adhesive 30 is used as an adhesive comprising the adhesive layer 51.

According to this printed wiring board 50, the adhesive layer 51 is provided on a part of one side 13b of the cover layer 13, so as to cover the conductive particle 14. As a result, when this printed wiring board 50 and another printed wiring board are electrically connected via the conductive particle 14, it is not necessary to separately prepare an adhesive. Therefore, it is possible to simplify the process of connecting the printed wiring board 50 and another printed wiring board. At the same time, it is possible to prevent the contamination of the working environment and the printed wiring board 50, occurring due to the application of an adhesive that is prepared separately.

Incidentally, the description of the above embodiment presented as an example, a printed wiring board 50 such that an adhesive layer 51 is provided on a part of one side 13b of the cover layer 13. However, the printed wiring board according to the present invention is not limited to this configuration.

The printed wiring board according to the present invention can be configured so that an adhesive layer is provided on the entire surface of one side of the cover layer.

Next, a manufacturing method of this printed wiring board 50 is described with reference to FIG. 4.

First, a conductive circuit 12 is provided on one side 11a of the insulated substrate 11.

Next, a cover-coating layer 13 in liquid form is applied, so as to cover the insulated substrate 11 and the conductive circuit 12.

Next, before the cover-coating layer 13 is solidified, the conductive particle 14 is placed on a predetermined position. At this time, the conductive particle 14 is placed so that the conductive particle 14 penetrates the cover-coating layer 13 in liquid form, and comes in contact with the conductive circuit 12.

Next, the cover-coating material 13 is solidified by heating.

Next, the adhesive layer 51 is formed, for example, by applying the adhesive material to a part of one side 13b of the cover layer 13, so as to cover the conductive particle 14. In this way, the printed wiring board 50 is obtained.

Next, a method of connecting this printed wiring board 50 with another printed wiring board is described with reference to FIGS. 5A and 5B.

Figure 5A:
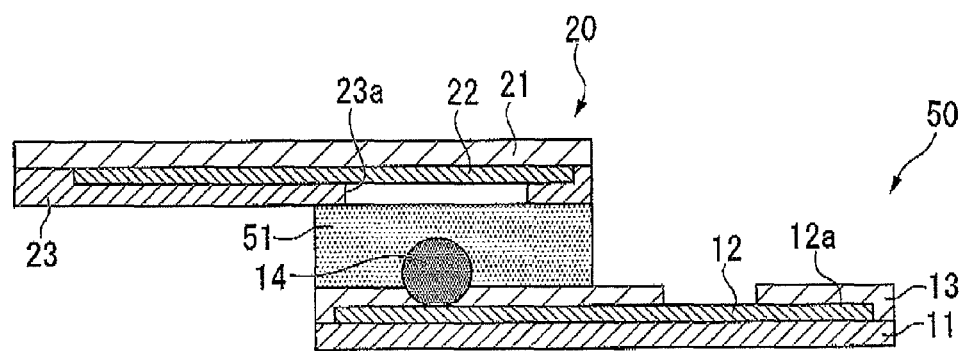
FIG. 5A is a skeletal cross sectional diagram showing a method of connecting a printed wiring board according to the second embodiment of the present invention.
Figure 5B:
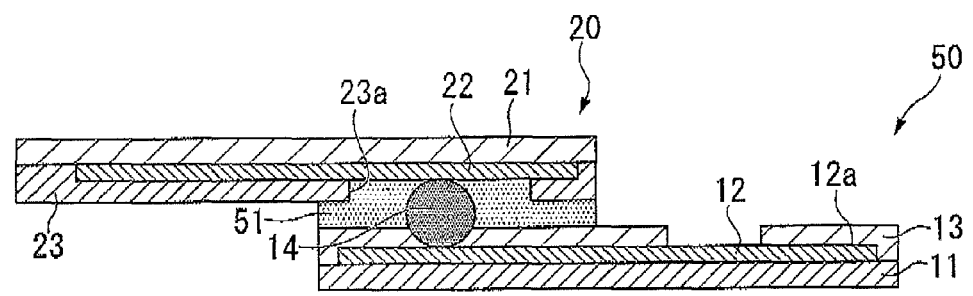
FIG. 5B is a skeletal cross sectional diagram showing a method of connecting a printed wiring board according to the second embodiment of the present invention.

FIGS. 5A and 5B are skeletal cross-sectional diagrams representing a second embodiment of a connection method of a printed wiring board according to the present invention.

In FIGS. 5A and 5B, the components that are the same as those of the first embodiment shown in FIG. 2 are referenced using the same reference numbers. In this way, overlapping components will not be described.

According to a connection method of a printed wiring board according to a second embodiment of the present invention, two printed wiring boards (printed wiring board 50 and printed wiring board 20) are connected via the adhesive layer 51 of the printed wiring board 50.

In other words, according to this connection method of the printed wiring board, the adhesive layer 51 of the printed wiring board 50 first contacts the cover layer 23 of the printed wiring board 20, so that the conductive particle 14 covered by the adhesive layer 51 is placed at a position facing the opening portion 23a of the printed wiring board 20, as shown in FIG. 5A, and is then fixed temporarily to maintain this condition.

Next, the adhesive layer 51 is heated, as shown in FIG. 5B. At the same time, the conductive particle 14 contacts the conductive circuit 22 of the printed wiring board 20 by the pressing of the printed wiring board 50 against the printed wiring board 20. This conductive particle 14 is placed on one side 12a of the conductive circuit 12 of the printed wiring board 50. In this way, the printed wiring board 20 and the printed wiring board 50 are electrically connected via the conductive particle 14. At the same time the contacting portion of the printed wiring board 20, the printed wiring board 50, and the conductive particle 14, as well as its surrounding area, are bonded by the adhesive layer 51. As a result, the electrical connection between these wiring boards is fixed.

In other words, the adhesive making up the adhesive layer 51 is fused by heating the adhesive layer 51. At the same time, the printed wiring board 50 is pressed against the printed wiring board 20. As a result, the conductive particle 14 penetrates the fused adhesive, and contacts the conductive circuit 22 of the printed wiring board 20. Then, the heating is suspended, and the adhesive is solidified. In this way, the printed wiring board 20 is bonded to the printed wiring board 50 via the adhesive layer 51.

According to the method of connecting the printed wiring board based on the present embodiment, the printed wiring board 20 and the printed wiring board 50 are connected by the adhesive layer 51 covering the conductive particle 14 placed on one side 12a of the conductive circuit 12 of the printed wiring board 50. Therefore, it is not necessary to separately prepare an adhesive when the printed wiring board 20 is electrically connected to the printed wiring board 50 via the conductive particle 14. Thus, it is possible to simplify the process of connecting the printed wiring board 20 and the printed wiring board 50. At the same time, it is possible to prevent the contamination of the working environment, the printed wiring board 20, or the printed wiring board 50, occurring due to the application of an adhesive that is prepared separately.

(3) Third Embodiment

Figure 6:
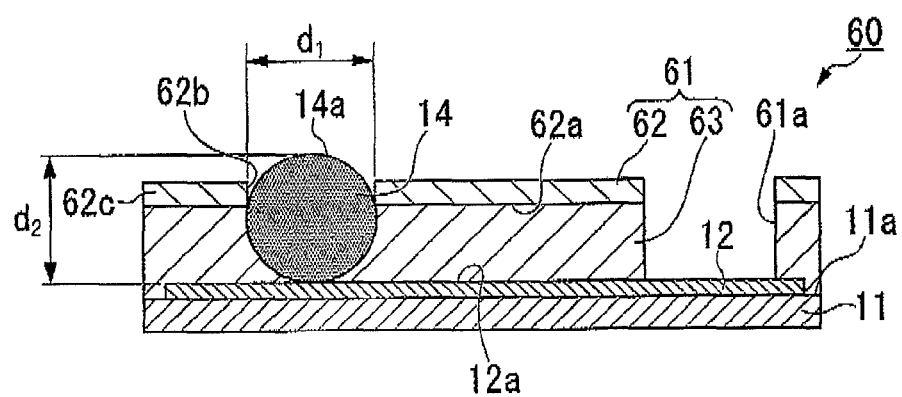
FIG. 6 is a skeletal cross sectional diagram showing a printed wiring board according to a third embodiment of the present invention.

FIG. 6 is a skeletal cross-sectional diagram representing a printed wiring board according to a third embodiment of the present invention.

In FIG. 6, the components that are the same as those described in the first embodiment and shown in FIG. 1 are referenced using the same reference numbers. In this way, overlapping components will not be described.

The printed wiring board 60 according to the third embodiment differs from the printed wiring board 10 according to the first embodiment, in that the cover layer includes a coverlay film 61 comprising a resin film 62 and an adhesive layer 63 provided on one side 62a of the resin film 62; a pore 62b is provided on the resin film 62 of this coverlay film 61; and a part of the conductive particle 14 is inserted in the pore 62b.

In other words, the adhesive layer 63 is placed so as to cover the conductive circuit 12 and the conductive particle 14 provided on one side 12a of the conductive circuit 12. At the same time, the coverlay film 61 is provided so that a part of the conductive particle 14 is inserted in the pore 62b of the resin film 62 from one side 62a of the resin film 62, in other words, from a side at which the coverlay film 61 contacts the conductive circuit 12.

In addition, when the inner diameter of the pore 62b of the resin film 62 equals $d_1$, and the diameter of the conductive particle 14 equals $d_2$, the variables $d_1$ and $d_2$ satisfy the inequality $d_1 < d_2$.

Further, the conductive particle 14 is inserted in the pore 62b of the resin film 62 from a side 62c of the resin film 62 where the resin film 62 does not contact the adhesive layer 63 so that a top portion 14a of the conductive particle 14 is exposed. Hereinafter, the side 62c will be referred to as "the other side 62c."

For example, the inner diameter $d_1$ of the pore 62b of the resin film 62 is set to 65 μm, and the diameter $d_2$ of the conductive particle 14 is set to 75 μm. Here, when the thickness of the resin film 62 is 12 μm, the top portion 14a of the conductive particle 14 protrudes from the resin film 62 by approximately 5 μm.

Furthermore, an opening portion 61a is provided on the coverlay film 61 to mount an electronic component. This opening portion 61a penetrates the resin film 62 and the adhesive layer 63 in the direction of their thickness. The conductive circuit 12 is exposed from this opening portion 61a.

Polyimide resin, polyethylene terephthalate (PET), polyethylene naphthalate (PEN), aramid resin, and the like, are used as resin making up the resin film 62.

An adhesive similar to the adhesive 30 is used as the adhesive making up the adhesive layer 63.

According to this printed wiring board 60, the cover layer includes the coverlay film 61. The pore 62b is provided on the resin film 62 of this coverlay film 61. When the inner diameter of the pore 62b equals $d_1$, and the diameter of the conductive particle 14 equals $d_2$, the diameters $d_1$ and $d_2$ satisfy the inequality $d_1 < d_2$. In addition, the conductive particle 14 is inserted in the pore 62b from one side 62a of the resin film 62. In this way, the conductive particle 14 is fixed on one side 12a of the conductive circuit 12 while the top portion 14a is exposed from the resin film 62. Therefore, when the printed wiring board 60 is electrically connected to another printed wiring board via the conductive particle 14, this conductive particle is prevented from shifting around. As a result, the printed wiring boards can be connected with more reliability.

Next, a method of connecting this printed wiring board 60 is provided with reference to FIG. 6.

First, a conductive circuit 12 is provided on one side 11a of the insulated substrate 11.

In addition, separate from the above process, a pore is formed on the coverlay film 61 including the resin film 62 and the adhesive material 63. Then, the conductive particle 14 is placed on a side of the adhesive material on the pore.

Next, the coverlay film 61, along with the conductive particle, is positioned so as to cover the conductive circuit 12. Then, the adhesive material 63 is fused by providing heat and pressure. In this way, a space between the conductive particle 14 and the pore is filled with the adhesive material 63. At the same time, the coverlay film 61 is bonded together with the insulated substrate 11. In this way, the printed wiring board 60 is obtained.

Next, a method of connecting the printed wiring board 60 with another printed wiring board is described with reference to FIG. 6.

According to the connection method of the printed wiring board according to the above embodiment, two printed wiring boards (printed wiring board 60 and another printed wiring board (not diagramed)) are connected via an adhesive.

Here, the other printed wiring board includes an insulated substrate, a conductive circuit provided on one side of the insulated substrate, and a cover layer covering the insulated substrate and the conductive circuit. In addition, an opening portion is provided on the cover layer. The conductive circuit is exposed from this opening portion.

In other words, according to the connection method of the printed wiring board based on the above embodiment, the top portion 14a of the conductive particle 14 contacts the conductive circuit of the other printed wiring board. The top portion 14a of the conductive particle 14 protrudes from the resin film 62 of the printed wiring board 60. As a result, these wiring boards are electrically connected through the conductive particle 14. At the same time, the contacting portion of the printed wiring board 60, the other printed wiring board, and the conductive particle 14, as well as the area surrounding the contacting portion, are bonded with an adhesive. In this way, the electrical connection between these wiring boards is fixed.

An adhesive similar to the adhesive 30 is used as the adhesive.

According to a connection method of a printed wiring board based on the above embodiment, the printed wiring board 60 and another printed wiring board are electrically connected via the conductive particle 14 protruding from the resin film 62 of the printed wiring board 60. Therefore, when the printed wiring board 60 is electrically connected to another printed wiring board, the conductive particle 14 is prevented from shifting around. As a result, the printed wiring boards can be connected with more reliability.

(4) Fourth Embodiment

Figure 7:
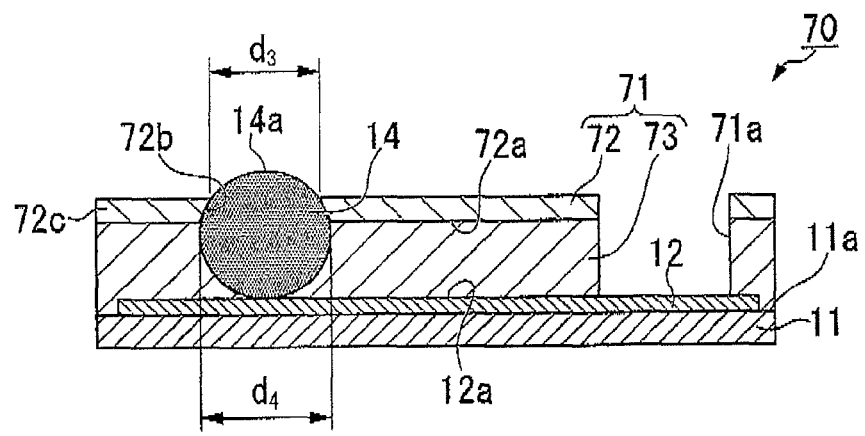
FIG. 7 is a skeletal cross sectional diagram showing a printed wiring board according to a fourth embodiment of the present invention.

FIG. 7 is a skeletal cross-sectional diagram representing a printed wiring board according to a fourth embodiment of the present invention.

In FIG. 7, the components that are the same as those described in the first embodiment and shown in FIG. 1 are referenced using the same reference numbers. In this way, overlapping components will not be described.

The printed wiring board 70 according to the fourth embodiment differs from the printed wiring board 10 according to the first embodiment, in that the cover layer includes a coverlay film 71 comprising a resin film 72 and an adhesive layer 73 provided on one side 72a of the resin film 72; a pore 72b is provided on the resin film 72 of this coverlay film 71; and a part of the conductive particle 14 is inserted in the pore 72b.

In other words, the adhesive layer 73 is placed so as to cover the conductive circuit 12 and the conductive particle 14 provided on one side 12a of the conductive circuit 12. At the same time, the coverlay film 71 is provided so that a part of the conductive particle 14 is inserted in the pore 72b of the resin film 72 from one side 72a of the resin film 72, in other words, from a side at which the coverlay film 71 contacts the conductive circuit 12.

In addition, the pore 72b is provided on the resin film 72 so that the pore 72b is tapered from one side 72a of the resin film 72 to the other side 72c of the resin film 72. In other words, the inner diameter of the pore 72b gradually decreases from the side of the resin film 72 at which the coverlay film 71 contacts the conductive circuit 12, to the other side of the resin film 72.

Further, when the inner diameter of the pore 72b at the other side 72c of the resin film 72 equals $d_3$, and the inner diameter of the pore 72b at one side 72a of the resin film 72 equals $d_4$, the diameters $d_3$ and $d_4$ satisfy the inequality $d_3 < d_4$.

Moreover, the conductive particle 14 is inserted in the pore 72b of the resin film so that the top portion 14a of the conductive particle 14 protrudes from the other side 72c of the resin film 72.

For example, the inner diameter $d_3$ of the pore 72b at the other side 72c of the resin film 72 is set to 65 μm, the inner diameter $d_4$ of the pore 72b at one side 72a of the resin film 72 is set to 80 μm, and the diameter of the conductive particle 14 is set to 75 μm. Here, when the thickness of the resin film 72 is 12 μm, the top portion 14a of the conductive particle 14 protrudes from the resin film 72 by approximately 20 μm.

Furthermore, an opening portion 71a is provided on the coverlay film 71 to mount an electronic component. The opening portion 71a penetrates the resin film 72 and the adhesive layer 73 in the direction of their thickness. The conductive circuit 12 is exposed from this opening portion 71a.

A material similar to the resin film 62 is used as a resin making up the resin film 72.

An adhesive similar to the adhesive 30 is used as an adhesive making up the adhesive layer 73.

According to this printed wiring board 70, the cover layer includes the coverlay film 71. The pore 72b is provided on the resin film 72 of the coverlay film 71. The diameter of the pore 72b gradually decreases from one side 72a of the resin film 72 to the other side 72c. When the inner diameter of the pore 72b at the other side 72c of the resin film 72 equals $d_3$, and the inner diameter of the pore 72b at one side 72a of the resin film 72 equals $d_4$, the diameters $d_3$ and $d_4$ satisfy the inequality $d_4 < d_4$. Since the conductive particle 14 is inserted in the pore 72b from one side 72a of the resin film 72 compared to the case of the printed wiring board 60 described above, the conductive particle 14 can be fixed on one side 12a of the conductive circuit 12 while the top portion 14a of the conductive particle 14 protrudes from the resin film 72. Therefore, when the printed wiring board 70 and another printed wiring board are electrically connected via the conductive particle 14, the conductive circuits of each printed wiring board will not come into contact with one another. Therefore, the printed wiring boards can be connected without triggering a crosstalk of the conductive circuit between the printed wiring boards.

Next, a method of manufacturing the printed wiring board 70 is provided with reference to FIGS. 8 to 13.

Figure 8:
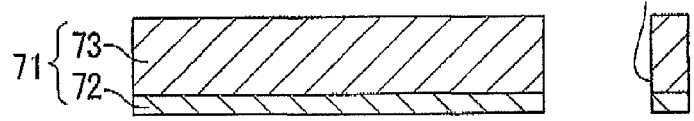
FIG. 8 is a skeletal cross sectional diagram showing a method of manufacturing a printed wiring board according to the fourth embodiment of the present invention.

First, a coverlay film 71 as shown in FIG. 8 is prepared. This coverlay film 71 includes a resin film 72 and an adhesive layer 73 provided on one side 72a of the resin film 72. An opening portion 71a is provided on this coverlay film 71. This opening portion 71a penetrates the resin film 72 and the adhesive layer 73 in the direction of their thickness.

Figure 9:
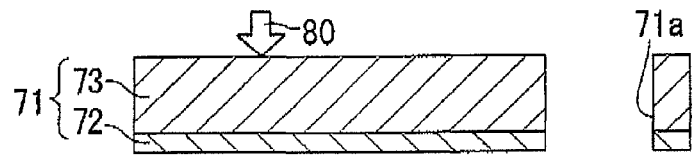
FIG. 9 is a skeletal cross sectional diagram showing a method of manufacturing a printed wiring board according to the fourth embodiment of the present invention.

Next, a laser beam 80 is applied to the coverlay film 71, as shown in FIG. 9, from the other side of the adhesive layer 73, at which the adhesive layer and the resin film 72 do not come in contact with one another.

Figure 10:
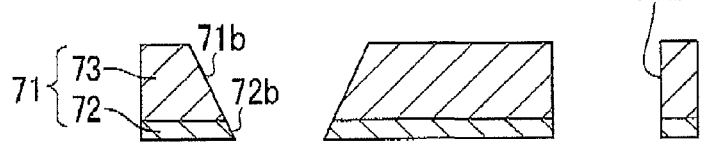
FIG. 10 is a skeletal cross sectional diagram showing a method of manufacturing a printed wiring board according to the fourth embodiment of the present invention.

As a result, as shown in FIG. 10, a pore 71b is provided on the coverlay film 71 so that the pore 71b is tapered from a side of the adhesive layer 73 at which the adhesive layer 73 does not contact the resin film 72 (in other words, a side at which the coverlay film 71 contacts the conductive circuit) to the other side 72c of the resin film 72 (in other words, a side at which the coverlay film 71 contacts the conductive circuit). The pore 72b, described above, is a part of the pore 71b. The pore 72b corresponds to the portion of the pore 71b provided on the resin film 72.

When the inner diameter of the pore 71b at a side of the coverlay film 71 at which the coverlay film 71 does not contact the conductive circuit equals $d_5$, and the inner diameter of the pore 71b at a side of the coverlay film 71 at which the coverlay film 71 contacts the conductive circuit equals $d_6$, the diameters $d_5$ and $d_6$ satisfy the inequality $d_5 < d_6$.

In addition, when the inner diameter of the pore 72b at the other side 72c of the resin film 72 equals $d_3$, and the inner diameter of the pore 72b at one side 72a of the resin film 72 equals $d_4$, the diameters $d_3$ and $d_4$ satisfy the inequality $d_3 < d_4$.

Incidentally, the variables $d_3$ and $d_5$ satisfy the equation $d_3 = d_5$.

Moreover, when the diameter of the conductive particle 14 equals $d_2$, the following is met: $(d_3 = d_5) < d_4 < d_2 < d_6$.

There is no particular limitation on the laser beam 80 applied to the coverlay film 71. Examples of this laser beam 80 include an ultraviolet laser with a wavelength of 354 nm, which is a third harmonic of the Nd:YVO4 laser; a carbon dioxide laser; and an exciplex laser.

Incidentally, according to the above embodiment, a laser beam is used to provide a pore 71b to the coverlay film 71. However, the method of manufacturing the printed wiring board according to the present invention is not limited to this configuration. For example, regarding the manufacturing method of the printed wiring board according to the present invention, a punch with a convexed tip can be penetrated through the coverlay film from a side at which the coverlay film contacts the conductive circuit. In addition, it is also possible to provide a hole through the coverlay film using a drill.

Figure 11:
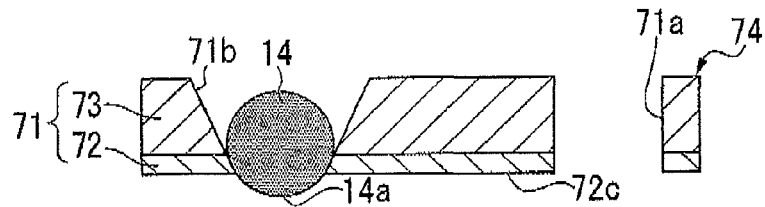
FIG. 11 is a skeletal cross sectional diagram showing a method of manufacturing a printed wiring board according to the fourth embodiment of the present invention.

Next, as shown in FIG. 11, a conductive particle 14 is packed into the pore 71b of the coverlay film 71 from a side of the adhesive layer 73 at which the adhesive layer 73 does not contact the resin film 72. Then, a part of the conductive particle 14 is inserted to the pore 72b of the resin film 72 so that a top portion 14a of the conductive particle 14 protrudes from the other side 72c of the resin film 72. In this way a coverlay film 74 is formed. The conductive particle 14 is partially embedded in this coverlay film 74. Hereinafter, the coverlay film 74 may be referred to as a "conductive particle-included coverlay film 74."

Figure 12:
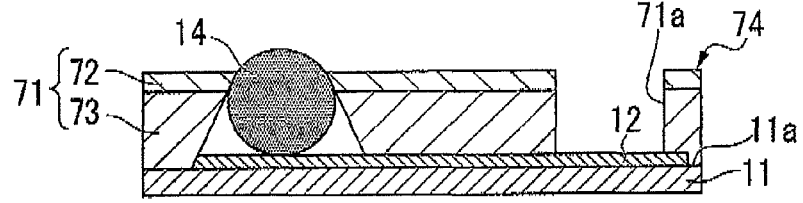
FIG. 12 is a skeletal cross sectional diagram showing a method of manufacturing a printed wiring board according to the fourth embodiment of the present invention.

Next, as shown in FIG. 12, the conductive particle-included coverlay film 74 is bonded with one side 11a of the insulated substrate 11, and is temporarily fixed, so that the conductive particle 14 of the conductive particle-included coverlay film 74 contacts the conductive circuit 12. This conductive circuit 12 is provided on one side 11a of the insulated substrate 11, which is separately prepared.

In other words, the adhesive layer 73 of the conductive particle-included coverlay film 74 is placed, so that the conductive particle 14 of the conductive particle-included coverlay film 74 contacts the conductive circuit 12, and the insulated substrate 11 and the conductive circuit 12 are covered.

Figure 13:
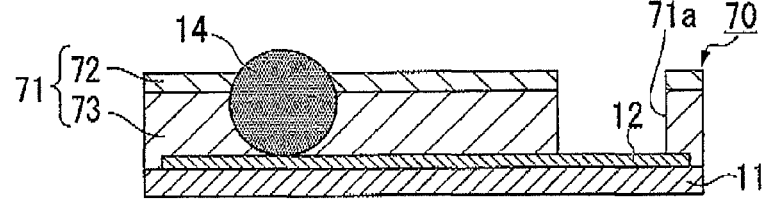
FIG. 13 is a skeletal cross sectional diagram showing a method of manufacturing a printed wiring board according to the fourth embodiment of the present invention.

Next, conductive particle 14 is adhered to the conductive circuit 12 by heating the adhesive layer 73 and pressing the conductive particle-included coverlay film 74 against the insulated substrate 11. At the same time, the adhesive layer 73 is bonded to the insulated substrate 11 and the conductive circuit 12. In this way, the printed wiring board 70 is formed, as shown in FIG. 13.

According to a method of manufacturing a printed wiring board according to the above embodiment, a pore 71b is provided on the coverlay film 71, so that the pore 71b is tapered from a side of the coverlay film 71 at which the coverlay film 71 contacts the conductive circuit 12, to the other side of the coverlay film 71 at which the coverlay film 71 does not contact the conductive circuit 12.

Further, a part of the conductive particle 14 is inserted in the pore 71b from a side of the coverlay film 71 at which the coverlay film 71 contacts the conductive circuit 12, so that a top portion 14a of the conductive particle 14 protrudes from the other side 72c of the resin film 72. In this way, the conductive particle-included coverlay film 74 is formed. Thereinafter, this conductive particle-included coverlay film 74 is bonded with the insulated substrate 11 on which the conductive circuit 12 is equipped. As a result, the conductive particle 14 can be fixed to one side 12a of the conductive circuit 12 while the top portion 14a of the conductive particle 14 protrudes from the resin film 72.

Figure 14:
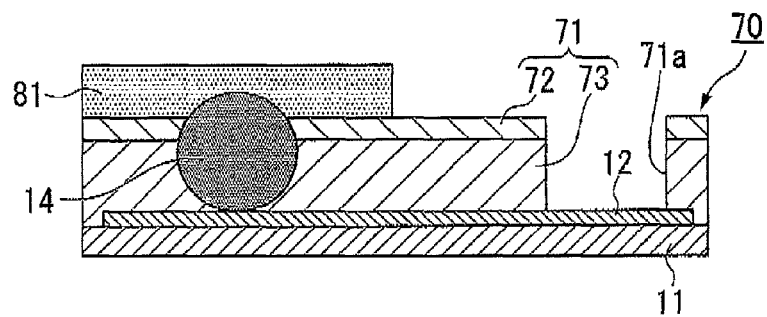
FIG. 14 is a skeletal cross sectional diagram showing a method of connecting a printed wiring board according to the fourth embodiment of the present invention.
Figure 15:
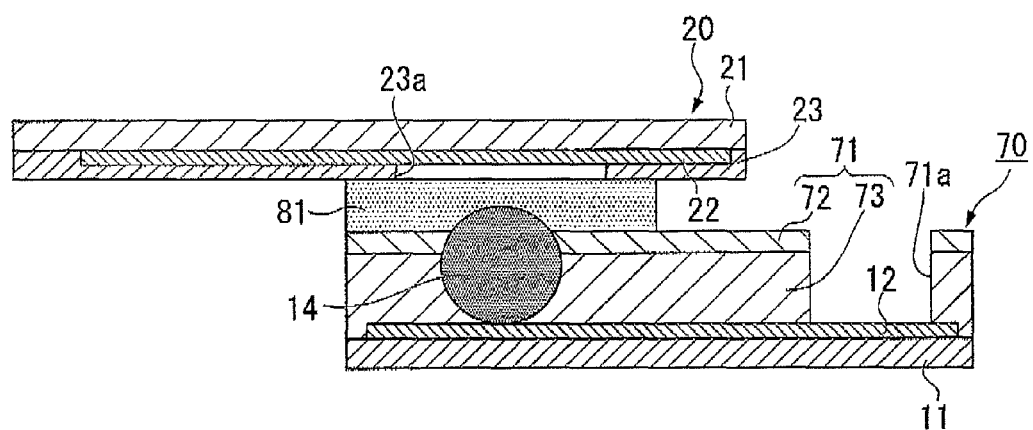
FIG. 15 is a skeletal cross sectional diagram showing a method of connecting a printed wiring board according to the fourth embodiment of the present invention.
Figure 16:
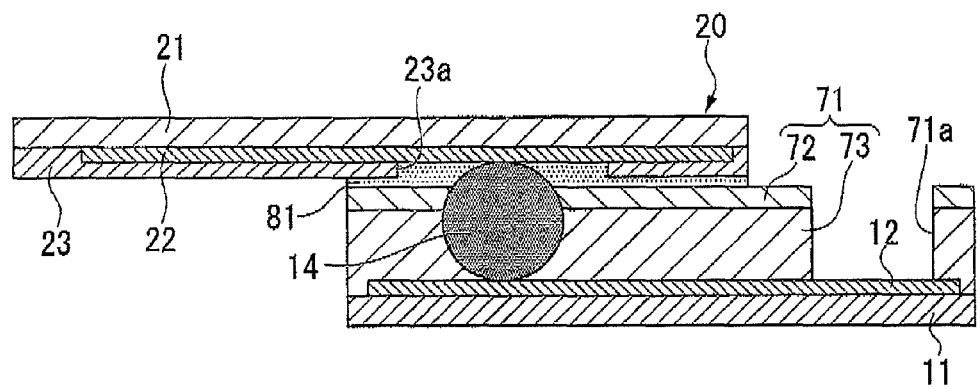
FIG. 16 is a skeletal cross sectional diagram showing a method of connecting a printed wiring board according to the fourth embodiment of the present invention.
Figure 17:
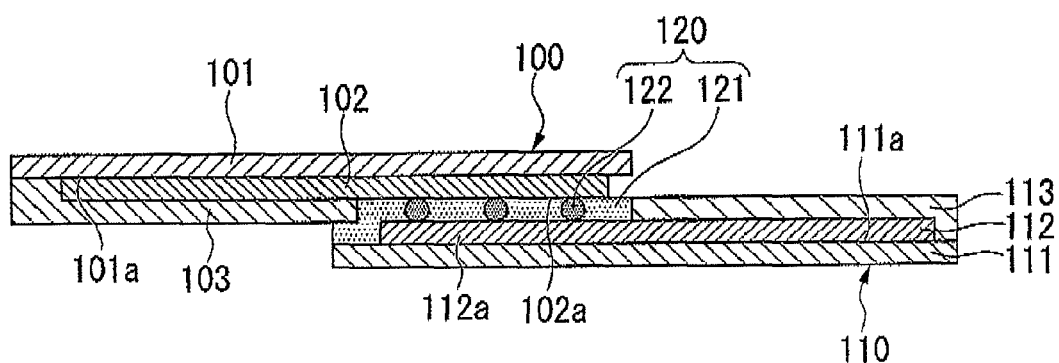
FIG. 17 is a skeletal cross sectional diagram showing an example of a method of connecting a printed wiring board using a conventional printed wiring board.
Figure 18:
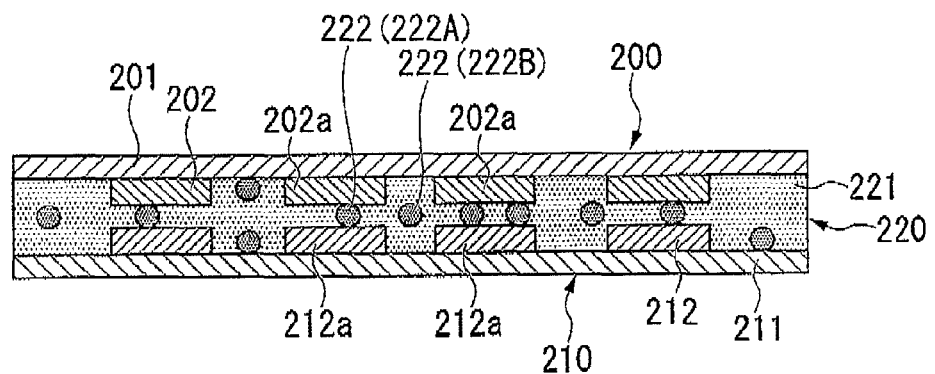
FIG. 18 is a skeletal cross sectional diagram representing a problem regarding a method of connecting a printed wiring board using a conventional printed wiring board.

Next, a method of connecting the printed wiring board 70 to another printed wiring board is described, with reference to FIGS. 14 to 16.

FIGS. 14 to 16 are skeletal cross-sectional diagrams representing a method of connecting a printed wiring board according to the fourth embodiment of the present invention.

In FIGS. 14 to 16, components that are the same as those described in the second embodiment and shown in FIG. 5 are referenced using the same reference numbers. In this way, overlapping components will not be described.

According to the connection method of the printed wiring board based on the above embodiment, two printed wiring boards (printed wiring board 20 and printed wiring board 70) are connected via an adhesive 81.

In other words, according to the connection method of this printed wiring board, the adhesive 81 is first applied to a part of the other side 72c of the resin film 72 of the coverlay film 71, as shown in FIG. 14. At this time, the adhesive 81 is applied so as to cover the conductive particle 14.

An adhesive similar to the adhesive 30 is used as the adhesive 81.

Next, the adhesive 81 applied to the printed wiring board 70 contacts the cover layer 23 of the printed wiring board 20, so that the conductive particle 14 covered by the adhesive layer 81 is placed at a position facing the opening portion 23a of the printed wiring board 20, as shown in FIG. 15, and is then fixed temporarily to maintain this condition.

Next, the adhesive 81 is heated. The printed wiring board 70 is pressed against the printed wiring board 20. As a result, the conductive particle 14 contacts the conductive circuit 22 of the printed wiring board 20, as shown in FIG. 16. This conductive particle 14 is placed on one side 12a of the conductive circuit 12 of the printed wiring board 70. In this way, the printed wiring board 20 and the printed wiring board 70 are electrically connected via the conductive particle 14. At the same time, the contacting portion of the printed wiring board 20, the printed wiring board 70, and the conductive particle 14, as well as its surrounding area, are bonded by the adhesive 81. As a result, the electrical connection between these wiring boards is fixed.

In other words, the adhesive 81 is heated and dissolved. Then, the printed wiring board 70 is pressed against the printed wiring board 20. As a result, the conductive particle 14 penetrates the adhesive 81. Further, the conductive particle 14 contacts the conductive circuit 22 of the printed wiring board 20. Then, the heating is suspended, and the adhesive 81 is solidified. In this way, the printed wiring board 20 is bonded to the printed wiring board 70 via the adhesive 81.

According to the connection method of the printed wiring board based on the above embodiment, the adhesive 81 is applied to a part of the other side 72c of the resin film 72, so that the adhesive 81 covers the conductive particle 14 protruding from the resin film 72 of the printed wiring board 70. The printed wiring board 20 and the printed wiring board 70 are bonded together by this adhesive 81. As a result, the printed wiring board 20 and the printed wiring board 70 are electrically connected via the conductive particle 14. Therefore, the conductive particle 14 is prevented from shifting around when the printed wiring board 20 is electrically connected to the printed wiring board 70. Consequently, the printed wiring boards can be connected to one another with more reliability.

While a preferred embodiment of the present invention has been described above, it should be understood that these are exemplary of the invention and are not to be considered as limiting the present invention. Additions, omissions, substitutions, and other modifications can be made without departing from the spirit or scope of the present invention. The invention is not to be considered as being limited by the foregoing description, and is only limited by the scope of the appended claims.

What is claimed is:

1. A printed wiring board comprising:
an insulated substrate;
a conductive circuit provided on one side of the insulated substrate;
a cover layer covering the insulated substrate and the conductive circuit; and
a conductive particle buried in the cover layer, wherein
the conductive particle is buried in the cover layer so that the conductive particle contacts the conductive circuit and protrudes from the cover layer;
the conductive particle serves as an electric contact point;
the conductive particle is configured to undergo an elastic deformation or a plastic deformation by pressing the printed wiring board to a terminal of another printed wiring board facing the conductive particle, and connect to a terminal of the other printed wiring board;
the cover layer includes a coverlay film;
a pore is provided on the coverlay film, the pore tapering gradually from a first side at which the coverlay film contacts the conductive circuit to a second side opposite to the first side at which the coverlay film contacts the conductive circuit;
an inequality d3<d4 is satisfied when d3 equals an inner diameter of the pore at the second side opposite to the first side at which the coverlay film contacts the conductive circuit, and d4 equals another inner diameter of the pore at the first side at which the coverlay film contacts the conductive circuit; and
the conductive particle is inserted in the pore from the first side at which the coverlay film contacts the conductive circuit,
wherein an adhesive layer is provided on at least a part of a side opposite to a side at which the cover layer contacts the conductive circuit, and the adhesive layer covers the conductive particle, and
wherein the adhesive layer includes a thermoplastic resin.

2. A printed wiring board according to claim 1, wherein the cover layer includes a coverlay film;
a pore is provided on this coverlay film;
an inequality $d_1<d_2$ is satisfied when an inner diameter of the pore equals $d_1$ and
the diameter of the conductive particle equals $d_2$; and the conductive particle is inserted in the pore from a side at which the coverlay film contacts the conductive circuit.

3. A. printed wiring board according to claim 1, wherein the conductive particle includes a resin particle and a metal layer formed on a surface of this resin particle.

* * * * *